(12) United States Patent
Lachartre (10) Patent No.: US 8,471,742 B2
(45) Date of Patent: Jun. 25, 2013

(54) QUANTIZATION DEVICE, RADIO-FREQUENCY RECEIVER COMPRISING SUCH A DEVICE AND QUANTIZATION METHOD

(75) Inventor: David Lachartre, Montbonnot (FR)

(73) Assignee: Commissariat a l'Energie Atomique et aux Energies Alternatives, Paris (FR)

( * ) Notice: Subject to any disclaimer, the term of this patent is extended or adjusted under 35 U.S.C. 154(b) by 103 days.

(21) Appl. No.: 13/090,527

(22) Filed: Apr. 20, 2011

(65) Prior Publication Data

US 2011/0255639 A1 Oct. 20, 2011

(30) Foreign Application Priority Data

Apr. 20, 2010 (FR) ..................................... 10 52988

(51) Int. Cl.
 *H03M 1/00* (2006.01)
(52) U.S. Cl.
 USPC ........... 341/138; 341/130; 341/160; 375/316; 327/50; 379/347; 704/222; 704/224; 704/225; 704/226
(58) Field of Classification Search
 USPC ..... 341/130–160; 375/316; 327/50; 379/347; 704/222, 224, 225, 206
 See application file for complete search history.

(56) References Cited

U.S. PATENT DOCUMENTS

| 6,535,846 | B1 * | 3/2003 | Shashoua ...................... 704/225 |
| 7,324,037 | B1 * | 1/2008 | Tan et al. ...................... 341/155 |
| 2010/0174539 | A1 * | 7/2010 | Nandhimandalam et al. ............................. 704/222 |
| 2011/0095927 | A1 * | 4/2011 | Pagnanelli .................... 341/166 |
| 2011/0163900 | A1 * | 7/2011 | Pagnanelli .................... 341/143 |
| 2012/0068867 | A1 * | 3/2012 | Pagnanelli .................... 341/120 |
| 2012/0127009 | A1 * | 5/2012 | Pagnanelli .................... 341/143 |

OTHER PUBLICATIONS

French Preliminary Search Report issued Feb. 22, 2011, in French 10 52988, filed Apr. 20, 2010 (with English Translation of Category of Cited Documents).

* cited by examiner

*Primary Examiner* — Lam T Mai
(74) *Attorney, Agent, or Firm* — Oblon, Spivak, McClelland, Maier & Neustadt, L.L.P.

(57) ABSTRACT

A device for continuous time quantization of an input signal, in order to supply a continuous time output signal that is quantized as two bits, the device including: an electronic circuit, designed to supply a first bit of the output signal called the sign bit which at any time takes a first value when the input signal is positive and a second value when the input signal is negative, and an envelope analysis circuit designed to supply a second bit of the output signal called the envelope variation bit which at any time takes a first value, called high value, when an envelope signal of the input signal is increasing, and a second value, called low value, when the envelope signal is decreasing.

9 Claims, 8 Drawing Sheets

QUANTIZATION DEVICE, RADIO-FREQUENCY RECEIVER COMPRISING SUCH A DEVICE AND QUANTIZATION METHOD

The present invention concerns a quantization device, a radio-frequency receiver comprising such a device and a quantization method.

BACKGROUND OF THE INVENTION

Radio-frequency signals are also generally called radio signals and by extension radio-frequency signal receivers are referred to as radio receivers.

In the description and the claims that follow the following terminology will be used.

An "analogue signal" is a signal that can vary continuously both over time and in amplitude.

A "digital signal" is a signal which takes discrete values, at regular intervals over time.

A "sampled signal" is a signal whose value changes at regular intervals over time.

A "continuous time signal" is a non-sampled signal, that is, a signal whose value can change at any time.

A "quantized signal" is a signal which can take discrete values over time at any instant.

A "binary signal" is a quantized signal which can take a maximum of two values. A quantized signal which can take more than two values may be transmitted in the form of several binary signals, each representing one bit of the quantized signal.

"Decimate" means to suppress a part of the samples of a sampled signal in order to sub-sample the latter.

A "cycle" of a binary signal is the portion of the signal which extends from a predetermined transition of the signal, for example the transition from its high value to its low value, up to the following predetermined transition. In the case of a periodic signal, therefore, a cycle corresponds to one period of the signal.

A "quantization device", or "quantizer", is a device which transforms a signal into a quantized signal, that is, which supplies a quantized signal whose value depends on the value of the analogue signal over time.

The "positive envelope", hereafter referred to simply as "envelope", of a signal is a curve of low frequency in relation to the main frequency which seeks to join the peaks (local maxima) of the signal together. In the case of a carrier which is only amplitude modulated, the envelope is the amplitude modulation. A signal which takes positive and negative values also exhibits a negative envelope which seeks to join the downwards peaks (local minima) of the signal together. In the case of a signal which is symmetrical around zero, the negative envelope is approximately equal to the opposite of the positive envelope.

An analogue-digital converter is often an essential element of electronic devices, in particular of radio receivers with a digital architecture where the radio signal emerging from the antenna has to be digitised.

DESCRIPTION OF THE PRIOR ART

Several techniques exist which provide very different compromises.

The article entitled "1V 5-bit 5 GS/s CMOS ADC for UWB receivers" by I. Wang and S. Liu published in International Symposium on VLSI Design, Automation and Test, 2007, VLSI-DAT 2007, 25-27 Apr. 2007, pages 1-4, proposes a radio receiver equipped with a fast analogue-digital converter which samples the radio signal at least twice its highest frequency and over a relatively large number of bits. Since the radio signal being received may have a dynamic greater than 50 dB, quantization over at least 8 bits may be necessary. In addition, the higher the radio frequency then the greater the sampling frequency has to be. For example a signal transmitted at 2.4 GHz must be sampled at a rate of at least 4.8 GS/sec (i.e. sample rate). One drawback of this converter is that it is very power-hungry, since its power may reach several Watts.

In addition, the article entitled "A Subsampling Radio Architecture for Ultrawideband Communications", by S-W Chen and E. W. Brodersen, published in IEEE Transactions on Signal Processing, Volume 55, Issue 10, October 2007, pages 5018-5031, proposes a radio receiver which includes an analogue-digital converter designed to sample the radio signal at less than twice its frequency. This is what is known as "sub-sampling". The more the signal is sub-sampled, the greater the extent to which the converter speed constraint is relaxed, but to the detriment of the quality of the converted signal. In particular, the effect of sub-sampling is aliasing of the spectrum around the fundamental and the harmonics of the sampling frequency. This aliasing causes spurious signals to appear in the radio signal band which come from the aliased frequency bands. This technique for analogue-digital conversion of the radio signal in general requires an initial filtering in order to suppress all spurious signals which could undergo aliasing. The more a signal is sub-sampled, the tighter the filtering must be around its band. In addition, the sampling frequency cannot in spite of this fall below the radio signal bandwidth because of the risk of it aliasing it itself. Even when the signal is sub-sampled, the problem of quantization requiring a large number of dynamic bits persists. Furthermore, the sampling frequency cannot fall as low as might be wished to fall.

The number of quantization bits usually encountered to convert radio signals is significant in terms of complexity and therefore of the power consumption of the digital processing to be carried out in order to obtain a complete radio receiver. Thus even if the analogue-digital converter is not the principal electrical power load, a large number of quantization bits will adversely affect the consumption of the assembly. It is important for this number to be minimised, whatever the chosen sampling frequency might be.

In order to avoid sampling difficulties, some analogue-digital converters include first of all a continuous time quantizer, with the signal only being sampled later in the reception chain.

Thus the French patent application published as number FR 2 922 388 describes a device for quantizing an analogue signal which includes an electronic circuit designed to supply a binary signal, called the sign signal, which takes a first value when the input signal is positive and which takes a second value when the input signal is negative, and an electronic circuit designed to supply a quantized signal over several bits representing the amplitude of the analogue signal.

This quantizer still exhibits the drawback of requiring a large number of quantization bits.

It may therefore be desirable to envisage a quantizer which allows at least one part of the aforementioned problems and constraints to be overcome, in particular a quantizer which transforms the analogue signal into a quantized signal over few bits.

SUMMARY OF THE INVENTION

An object of the invention therefore is a device for the quantization in continuous time of an analogue signal, called the input signal, in order to supply an output signal which is quantized as two bits, which includes an electronic circuit called the sign analysis circuit, designed to supply a first bit of the output signal, called the sign bit, which takes at any instant a first value when the input signal is positive and a second value when the input signal is negative, and an electronic circuit, called the envelope analysis circuit, designed to supply a second bit of the output signal, called the envelope variation bit, which at any instant takes a first value, called the high value, when an envelope signal of the input signal is increasing, and a second value, called the low value, when the envelope signal is decreasing.

Thus, thanks to the invention, it is possible to obtain a signal that is quantized as only two bits (sign bit and envelope variation bit), which represents the input signal relatively faithfully. By this means the quantizer of the invention therefore supplies a decomposition of the input signal into the variation of its envelope and its sign.

It should be noted that the use of one bit for the sign of the signal is of particular interest when the analogue signal is centred around zero, as is the case, for example, with audio or radio waves.

The quantization device according to the invention is a continuous time device, that is, it supplies a continuous time output signal. In other words, the two bits of the output signal are not sampled by any timer.

Optionally, the envelope analysis circuit contains an electronic circuit, called the envelope variation command circuit, comprising a comparator designed to provide a binary signal, called the input/envelope comparison signal, which takes a first value when the envelope signal is greater than the input signal and a second value when the envelope signal is less than the input signal, and which is designed to provide the envelope variation signal from the input/envelope comparison signal, and an electronic circuit, called the envelope signal generation circuit, designed to generate the envelope signal so that this envelope signal is selectively increasing or decreasing depending on the value of the envelope variation signal.

Also optionally, the envelope signal is piecewise linear, and the envelope generation circuit is designed to generate the envelope signal selectively with a predetermined positive slope and a predetermined negative slope, as a function of the envelope variation signal.

Also optionally, the device includes in addition an electronic circuit, called the input/negative envelope comparison circuit, designed to supply a binary signal, called the input/negative envelope comparison signal, which takes a first value when the opposite of the envelope signal is greater than the input signal and a second value when the opposite of the envelope signal is less than the input signal, and an electronic circuit, called the comparisons combination circuit, designed to supply the envelope variation signal from the input/envelope comparison signal and from the input/negative envelope comparison signal.

Also optionally, the envelope variation command circuit includes an electronic circuit designed to supply the envelope variation signal so that it takes its high value throughout a sign bit cycle when the input/envelope comparison signal has taken its high value over at least part of the previous sign bit cycle, and its low value otherwise.

Also optionally, the circuit designed to supply the envelope variation signal includes an electronic circuit, called the memorisation circuit, designed to supply an electronic signal, called the memorised input/envelope comparison signal, which corresponds to the input/envelope comparison signal in which a high value which appears in a sign bit cycle is memorised until the end of the cycle.

Also optionally, the circuit designed to supply the envelope variation signal includes an electronic circuit, called the maintain circuit, designed to supply the envelope variation signal which corresponds to the memorised input/envelope comparison signal in which, for each sign bit cycle, the value of the input/envelope comparison signal memorised at the start of the cycle is captured and maintained up to the end of the cycle.

Another object of the invention is a radio-frequency signal receiver which includes an antenna designed to sense a radio-frequency signal and to convert it into an electrical signal, a quantization device according to the invention for quantizing an input signal obtained from the electrical signal supplied by the antenna, an electronic circuit, called the local radio oscillator circuit, designed to generate first and second signals, called respectively the in-phase and in-quadrature local radio oscillator signals, in quadrature with each other, and an electronic circuit, called the double mixer circuit, designed to supply two binary electrical signals, called respectively in-phase and in-quadrature base binary signals which correspond to the mixture of the product of the sign signal and of the envelope variation signal with, respectively, the two local oscillator signals.

Another object of the invention is a method for the quantization of an analogue signal, called the input signal, which includes: supplying a binary signal, called the sign signal, which takes a first value when the input signal is positive and a second value when the input signal is negative, and supplies a binary signal, called the envelope variation signal, which takes a first value, called the high value, when an envelope signal of the input signal is increasing, and a second value, called the low value, when the envelope signal is decreasing.

BRIEF DESCRIPTION OF THE DRAWINGS

The invention will be better understood with the help of the following description, given solely by way of an example, whilst referring to the appended diagrams, in which.

DESCRIPTION OF THE PREFERRED EMBODIMENTS

Although the quantization device of the invention is described in the context of radio receivers, the invention is not limited to this use. The quantization device in the invention may indeed be used in other devices, such as, for example, audio signal converters, movement and vibration phenomena sensors, and in particular those which include an analogue digital converter. Those skilled in the art will be able to adapt the quantization device of the invention to these applications.

Figure 1:
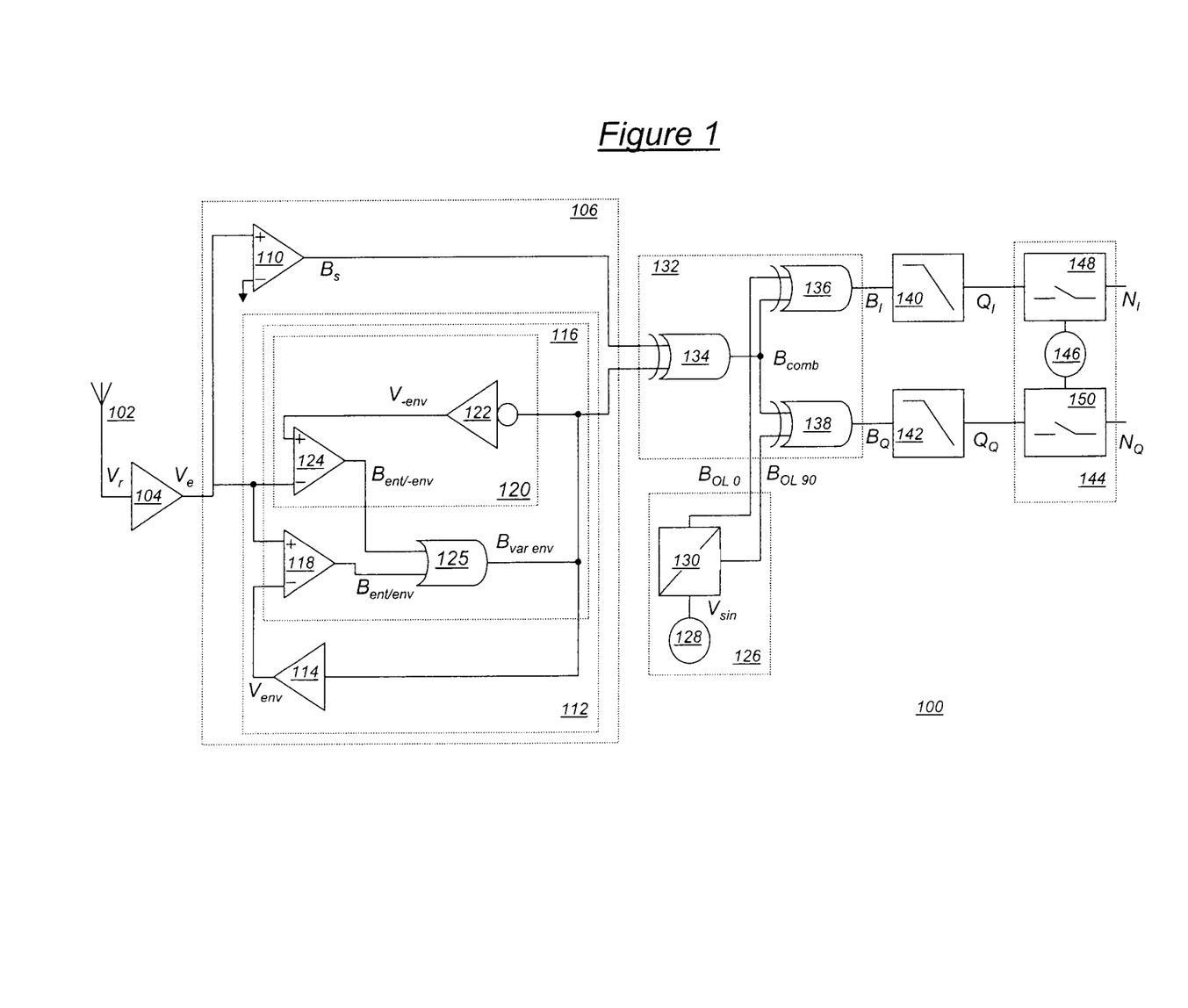
FIG. 1 is a diagram which represents a radio receiver according to a first embodiment of the invention.

With reference to FIG. 1, a radio receiver 100 according to a first embodiment of the invention includes first of all a radio antenna 102 designed to sense a radio signal and convert it into an electrical signal called $V_r$. In the example described, the radio receiver is a so-called zero-IF IQ receiver, that is, with zero intermediate frequency. The radio signal includes a high frequency carrier (from 30 Kilo Hertz to 100 Giga Hertz), modulated by a carrier signal for the information to be transmitted, generally at much lower frequencies than those of the carrier.

The radio receiver 100 includes, in addition, an amplifier 104 designed to amplify the signal $V_r$ with a low noise contribution, such as an LNA (Low Noise Amplifier). To this end the amplifier 104 is equipped with an input connected to the radio antenna 102 and an output supplying an analogue electrical signal, called the input signal $V_e$.

The radio receiver 100 in addition includes a device 106 for quantizing the input signal $V_e$ into an output signal quantized in two bits. In the example described, the output signal includes two continuous time binary electrical signals (also called logic signals), called, respectively, the sign bit $B_s$ and the envelope variation bit $B_{var\ env}$.

To this end, the quantization device 106 includes first of all an electronic circuit, called the sign analysis circuit 110, designed to supply the sign bit $B_s$ of the input signal $V_e$ so that it takes a high value when the input signal $V_e$ is positive and a low value when the input signal $V_e$ is negative. In the example described, the sign analysis circuit 110 is an asynchronous comparator whose positive analogue input is connected to the output of the amplifier 104, whose negative analogue input is connected to an electrical ground of the radio receiver 100 and whose binary output supplies the sign bit $B_s$. An asynchronous comparator is a comparator designed to supply, at any instant, the result of a comparison between its analogue inputs at its binary logic output, with no need for a timer, so that this output is not sampled. The comparator 110 is thus designed to compare the input signal $V_e$ with the electrical ground and to supply the sign bit $B_s$ as a function of the result of the comparison.

The quantization device 106 includes in addition an electronic circuit, called the envelope analysis circuit 112, designed to supply the envelope variation bit $B_{var\ env}$ of the input signal $V_e$ so that it takes a high value when an envelope signal of the input signal $V_e$ is increasing, and a low value when the envelope signal is decreasing.

In the example in FIG. 1, the envelope analysis circuit 112 includes first of all an electronic circuit, called the envelope generation circuit 114 designed to generate the envelope signal $V_{env}$.

The envelope analysis circuit 112 includes in addition an electronic circuit, called the envelope variation command circuit 116, designed to supply the envelope variation signal $B_{var\ env}$, as a function of the input signal $V_e$ and of the envelope signal $V_{env}$.

In the example in FIG. 1, the envelope variation command circuit 116 includes first of all an electronic circuit, called the input/envelope comparison circuit 118, designed to supply a binary signal, called the input/envelope comparison signal $B_{ent/env}$, which takes a high value when the input signal $V_e$ is greater than the envelope signal $V_{env}$ and a low value when the input signal $V_e$ is less than the envelope signal $V_{env}$. In the example in FIG. 1, the input/envelope comparison circuit 118 is an asynchronous comparator whose positive analogue input is connected to the output of the amplifier 104 whose negative analogue input is connected to the envelope generation circuit 114 to receive the envelope signal $V_{env}$ and whose output supplies the input/envelope comparison signal $B_{ent/env}$.

In addition, the envelope variation command circuit 116 includes an electronic circuit, called the input/negative envelope comparison circuit 120, designed to supply a binary electrical signal, called the input/negative envelope comparison signal $B_{ent/-env}$, which takes a high value when the opposite of the envelope signal is greater than the input signal $V_e$ and a low value when the opposite of the envelope signal is less than the input signal $V_e$.

In the example in FIG. 1, the input/negative envelope comparison circuit 120 includes an electronic circuit, called the negative envelope generator circuit 122, designed to generate a negative envelope signal $V_{-env}$ which has the same absolute value as the envelope signal $V_{env}$ but with a negative sign.

The input/negative envelope comparison circuit 120 in addition includes an electronic circuit, called the input/negative envelope comparison circuit 124, designed to supply the input/negative envelope comparison signal $B_{ent/-env}$, which takes a high value when the input signal $V_e$ is less than the negative envelope signal $V_{-env}$ and a low value when the input signal $V_e$ is greater than the negative envelope signal $V_{-env}$. In the example in FIG. 1, the input/negative envelope comparison circuit 124 is an asynchronous comparator whose negative analogue input is connected to the output of the amplifier 104, whose positive analogue input is connected to the negative envelope generation circuit 122 to receive the negative envelope signal $V_{-env}$, and whose logic output supplies the input/negative envelope comparison signal $B_{ent/-env}$.

The envelope variation command circuit 116 includes in addition an electronic circuit, called the comparisons combination circuit 125, designed to supply the envelope variation signal $B_{var\ env}$ from the input/envelope comparison signal $B_{ent/env}$ and from the input/negative envelope comparison signal $B_{ent/-env}$. In the example in FIG. 1, the comparisons combination circuit 125 is an OR logic gate one input of which is connected to the output of the comparator 118, whose other input is connected to the output of the comparator 124 and whose output supplies the envelope variation signal $B_{var\ env}$. Thus the envelope variation signal $B_{var\ env}$ takes its high value when one of the inputs is at its high value, that is when input signal Ve is greater than the envelope signal $V_{env}$ or less than the negative envelope signal $V_{-env}$, and takes its low value when the two inputs are at their low value, that is when the input signal $V_e$ is less than the envelope signal $V_{env}$ and greater than the negative envelope signal $V_{-env}$. Thus the faster the envelope signal increases, the more numerous are the transitions from low value to high value and the longer and more numerous are the plateaux at high values in the envelope variation signal, and conversely, the faster the envelope signal decreases, the more numerous are the transitions from high value to low value and the longer and the more numerous are the plateaux at low value in the envelope variation signal.

In the example in FIG. 1, the envelope generator circuit 114 is an integrator whose input is connected to the output of the OR logic gate and whose output is connected to the negative input of the comparator 118. The integrator 114 is designed to generate a piecewise linear envelope signal $V_{env}$, where the envelope signal $V_{env}$ is increasing with a predetermined positive slope (also called the integration constant) when the envelope variation signal $B_{var\ env}$ is at its high value and is decreasing with a predetermined negative slope (also called the integration constant) when the envelope variation signal $B_{var\,env}$ is at its low value. The positive slope has a greater absolute value than that of the negative slope, preferably at least twice as great. Furthermore, the absolute values of the slopes are selected to be very small in relation to the carrier frequency.

In the example in FIG. 1, the negative envelope generator circuit 122 is also an integrator whose input is connected to the output of the OR logic gate and whose output is connected to the negative input of the comparator 124. The integrator 122 is designed to generate a piecewise linear negative envelope signal $V_{-env}$, where the negative envelope signal $V_{-env}$ is increasing with a predetermined positive slope (equal to the negative slope of the integrator 114) when the envelope variation signal $B_{var\,env}$ is at its low value and is decreasing with a predetermined negative slope (equal to the positive slope of the integrator 114) when the envelope variation signal $B_{var\,env}$ is at its high value. The integrator 122 is, for example, made up of an integrator which is identical to integrator 114, preceded by a NO logic gate in order to obtain time constants of the two integrators of opposite signs.

The radio receiver 100 in addition includes an electronic circuit, called the local radio oscillator circuit 126, designed to generate first and second binary signals, called in-phase $B_{OL\,0}$ and in-quadrature $B_{OL\,90}$ local oscillator signals, which are in quadrature with each other. In the example in FIG. 1 the local radio oscillator circuit 126 includes a local oscillator 128 whose output supplies a signal $V_{sin}$ which is the squared logic of values −1 and +1, and an electronic circuit called the quadrature circuit 130, whose input is connected to the output of the local oscillator 128 and whose two outputs respectively supply the in-phase $B_{OL\,0}$ and in-quadrature $B_{OL\,90}$ local oscillator signals.

The radio receiver 100 includes in addition an electronic circuit called the double mixer 132, designed to mix the product of the sign signal and of the envelope variation signal with, respectively, the two local oscillator signals $B_{OL\,0}$ and $B_{OL90}$. "Mixing" means an operation whose result supplies a signal which exhibits at least one frequency equal to the difference of frequencies of the two mixed signals and which forms the base band in a zero-IF receiver. The base band is the band of frequencies which the signal (indivisible) possesses once demodulated or, in an equivalent manner, before it is modulated. The output signal also exhibits a frequency at the sum of the frequencies of the two mixed signals, which will be filtered as will be explained later. The double mixer 132 thus supplies two mixed binary signals, in-phase $B_I$ and in-quadrature $B_Q$ respectively, which correspond to the two previous mixtures.

In the example in FIG. 1, the double mixer 132 includes first of all a multiplier 134 called the sign/envelope variation multiplier, one input of which is connected to the output of the envelope analysis circuit 112, the other of which is connected to the output of the comparator 110 and whose output supplies a binary signal, called the combined signal $B_{comb}$, equal to the multiplication product of the two input signals $B_s$ and $B_{var\,env}$. The sign/envelope variation multiplier 134 is for example an exclusive OR logic gate.

The double mixer 132 contains in addition two multipliers, called respectively the in-phase multiplier 136 and in phase quadrature multiplier 138, each of which exhibits one input connected to the output of the sign/envelope variation multiplier 134 and another input connected, for the in-phase multiplier 136, to the output of the quadrature circuit 130 which supplies the local in-phase oscillator signal $B_{OL\,0}$, and for the in phase quadrature multiplier 138, to the output of the quadrature circuit 130 which supplies the local in-quadrature oscillator signal $B_{OL\,90}$. In the example in FIG. 1, the in-phase 136 and in-quadrature 138 multipliers are exclusive OR logic gates.

The radio receiver 100 includes in addition two low-pass filters, called, respectively, low pass phase filter 140 and low-pass quadrature filter 142, equipped with inputs connected respectively to the output of the in-phase multiplier 136 and to the output of the in-quadrature multiplier 138 and with outputs which supply quantized signals, called respectively in-phase $Q_I$ and in-quadrature $Q_Q$ base band quantized signals. In the example described, the low-pass filters 140 and 142 are continuous time digital filters, that is, the output signal is quantized but not sampled. Alternatively, the low-pass filters 140, 142 are analogue filters, for example of the RC type, which supply analogue signals, called, respectively, in-phase $Q'_I$ and in-quadrature $Q'_Q$ base band analogue signals.

The low pass-filters 140,142 are anti-aliasing filters, that is, whose function is to reduce aliasing which may occur in the sampler 144 which will be described below. To this end, the cut-off frequency of low pass filters 140, 142 is selected to be less than half the sampling frequency. Thus the low pass filters 140, 142 only deal with the aliasing problem. In particular they do not carry out a channel filter function.

The radio receiver 100 includes in addition a double sampler 144 designed to carry out low frequency sampling of the two base-band signals $Q_I$ and $Q_Q$ in order to supply two digital signals, called respectively the in-phase $N_I$ and in-quadrature $N_Q$ base-band signals.

In the example in FIG. 1, the double sampler 144 includes a timer 146 equipped with an output which supplies a baseband timer binary signal, and two samplers, called respectively the phase sampler 146 and quadrature sampler 148, whose inputs are connected to the timer 146 and to the output of respectively the phase 140 and quadrature 142 anti-aliasing low-pass filters, and whose outputs supply digital in-phase $N_I$ and in-quadrature $N_Q$ base band digital signals.

In the case where the low-pass filters are analogue, each sampler 146, 148 is, in fact, an analogue digital converter which includes a quantization circuit (not represented) for, in addition to sampling, quantizing the base band analogue signals $Q'_I$ and $Q'_Q$.

It will be seen that sampling is carried out far away in the reception chain, in particular, after mixing. Thus sampling may be carried out at a base-band frequency, which reduces the power consumed by the double sampler 144.

Generally the double sampler 144 will be followed by digital filters (not represented) whose function is to perform actual channel filtering. These channel filters are generally low-pass filters, but may also be band-pass filters. In both cases these filters are characterised by cut-off gradients which are much more abrupt than those of the anti-aliasing filters 140, 142.

Figure 2:
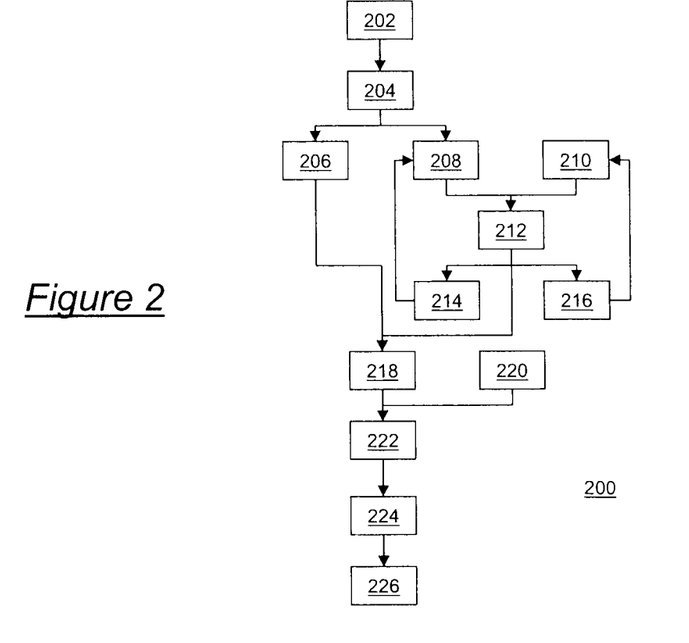
FIG. 2 is a block diagram illustrating the successive steps in a reception method implemented by the radio receiver in FIG. 1.

With reference to FIG. 2, an operating method 200 of the radio receiver 100 in FIG. 1 will now be described.

During a step 202, a radio signal is received by the antenna 102 and converted into an electrical signal $V_r$.

During a step 204, the electrical signal $V_r$ is amplified by the amplifier 104 which supplies the input signal $V_e$.

During a step 206, the comparator 110 compares the input signal $V_e$ with the ground to provide the sign signal $B_s$.

During a step 208, the comparator 118 compares the input signal $V_e$ with the envelope signal $V_{env}$ to supply the input/envelope comparison signal $B_{ent/env}$.

During a step 210, the comparator 114 compares the input signal $V_e$ with the negative envelope signal $V_{-env}$ to provide the input/negative envelope comparison signal $B_{ent/-env}$.

During a step 212, the OR logic gate 112 combines the two comparisons to give the envelope variation signal $B_{var\ env}$. This signal indicates the direction in which the envelope signal must vary.

During a step 214, the integrator 114 generates the envelope signal $V_{env}$ used in step 208, in accordance with the envelope variation signal $B_{var\ env}$, that is, with a positive slope when the envelope variation signal is at its high value and with a negative slope when the envelope variation signal is at its low value.

During a step 216, the integrator 122 generates the negative envelope signal $V_{-env}$ used in step 210, in accordance with the envelope variation signal $B_{var\ a\ env}$, that is, with a negative slope when the envelope variation signal is at its high value and with a positive slope when the envelope variation signal is at its low value.

During a step 218, the exclusive OR logic gate 134 multiplies the sign signal $B_s$ with the envelope variation signal $B_{var\ env}$ to supply the combined signal $B_{comb}$.

During a step 220 the local radio oscillator signal 126 supplies the in quadrature signals $B_{OL\ 0}$ and $B_{OL\ 90}$.

During a step 222, the exclusive OR logic gates 136 and 138 multiply the combined signal $B_{comb}$ with, respectively, the in-phase local oscillator signal $B_{OL\ 0}$ and the in-quadrature signal $B_{OL\ 90}$.

During a step 224, the anti-aliasing low-pass filters 140 and 142 filter the high frequencies of signals $B_I$ and $B_Q$ to supply the base quantized signals $Q_I$ and $Q_Q$.

Finally, during a step 226, the double sampler 144 samples the base band quantized signals $Q_I$ and $Q_Q$ to supply the base band digital signals $N_I$ and $N_Q$.

Figure 3:
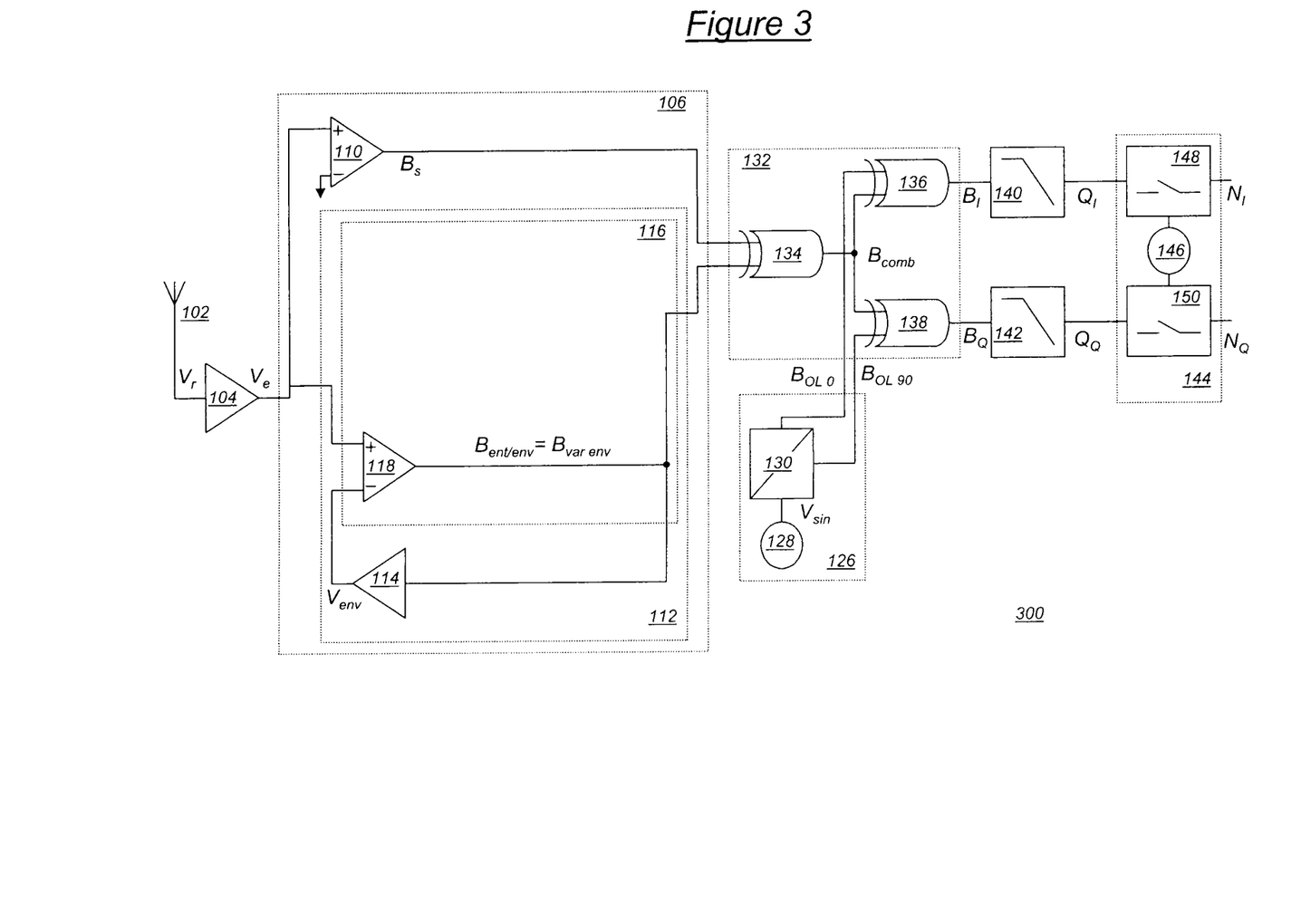
FIG. 3 is a diagram which represents a radio receiver according to a second embodiment of the invention.

With reference to FIG. 3, a radio receiver 300 according to a second embodiment of the invention will now be described.

The radio receiver 300 is identical to that of FIG. 1 except that the envelope variation command circuit 116 does not contain either the input/negative envelope comparison circuit 120 or the comparisons combination circuit 125, so that the envelope variation signal $B_{var\ env}$ is the input/envelope comparison signal $B_{ent/env}$.

The receiver 300 offers the advantage of being simpler than that in FIG. 1, without the quantization quality being too degraded, insofar as the radio signal modulation signal extends into frequencies much lower than that of the carrier so that the carrier varies very little in a sign bit cycle. It is therefore possible to disregard one or other of the envelope alternations and to consider the envelope as remaining constant throughout one sign bit cycle.

The operation of the radio receiver 300 follows the method in FIG. 2 except that steps 210, 212 and 216 are not implemented and that steps 214 and 218 follow on directly from step 208.

Figure 4:
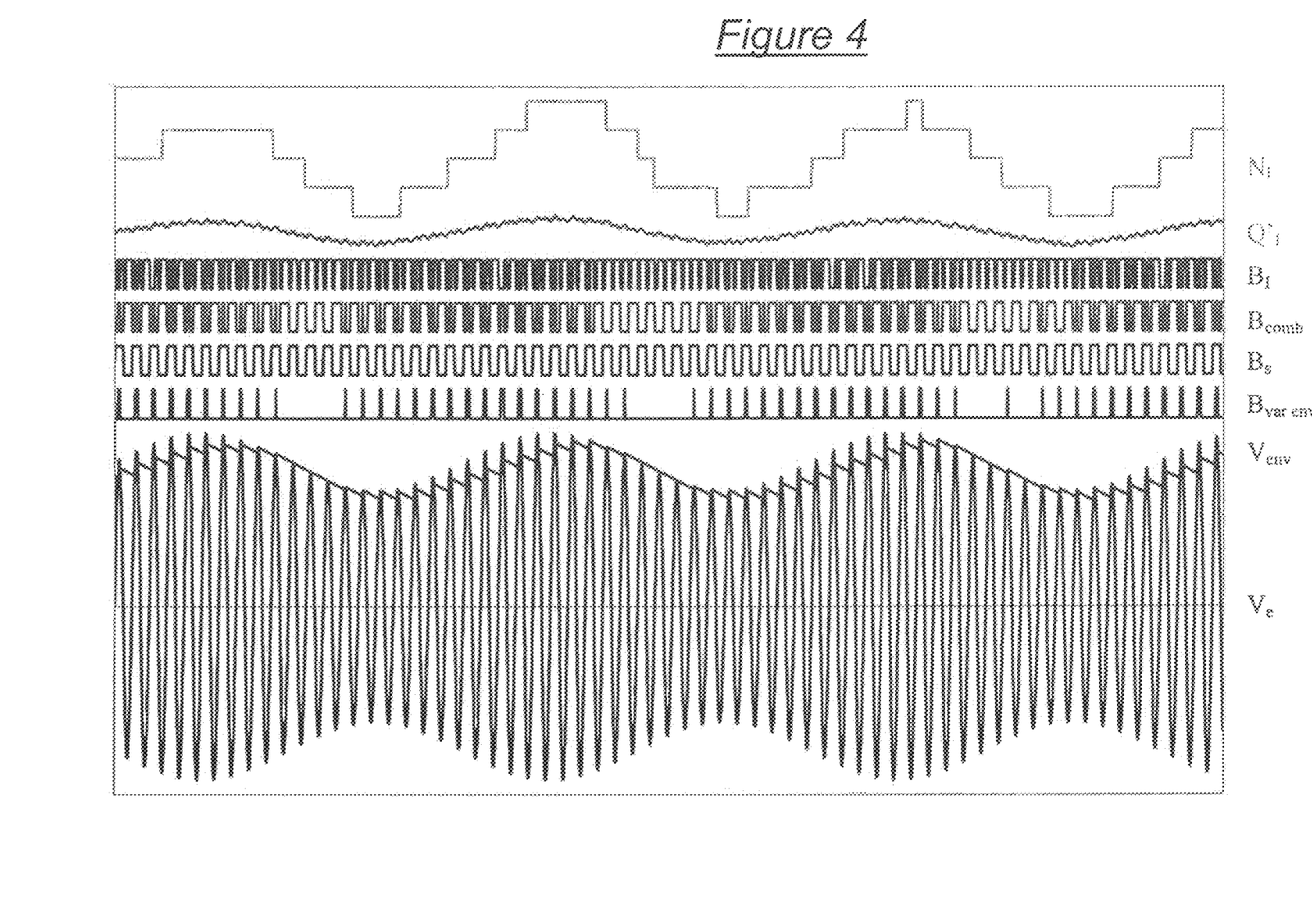
FIG. 4 is a diagram which represents the evolution over time of electrical signals at various points of the radio receiver in FIG. 3 during its operation.

The variations over time of the input signal $V_e$, the envelope signal $V_{env}$, the envelope variation signal $B_{var\ env}$, the combined signal $B_{comb}$, the in-phase base band binary signal $B_I$, the filtered analogue signal before quantization ($Q'_I$), and the in-phase base band digital signal $N_I$, of the receiver 300 are illustrated in FIG. 4.

The example in FIG. 4 represents the case where analogue low-pass filters 140, 142 are used. They offer the advantage of being very simple. In this figure the high and low values of binary signals have been arbitrarily taken as −1V and +1V respectively. The filtered analogue signals before quantization $Q'_I$ and $Q'_I$ are converted into digital signals by the analogue digital converters 150, 158 which, since they operate at low frequency, are highly conventional and consume little power.

The receiver 300 offers the advantage that the amplitude of the filtered signals can be chosen so that they are not perturbed by noise.

Figure 5:
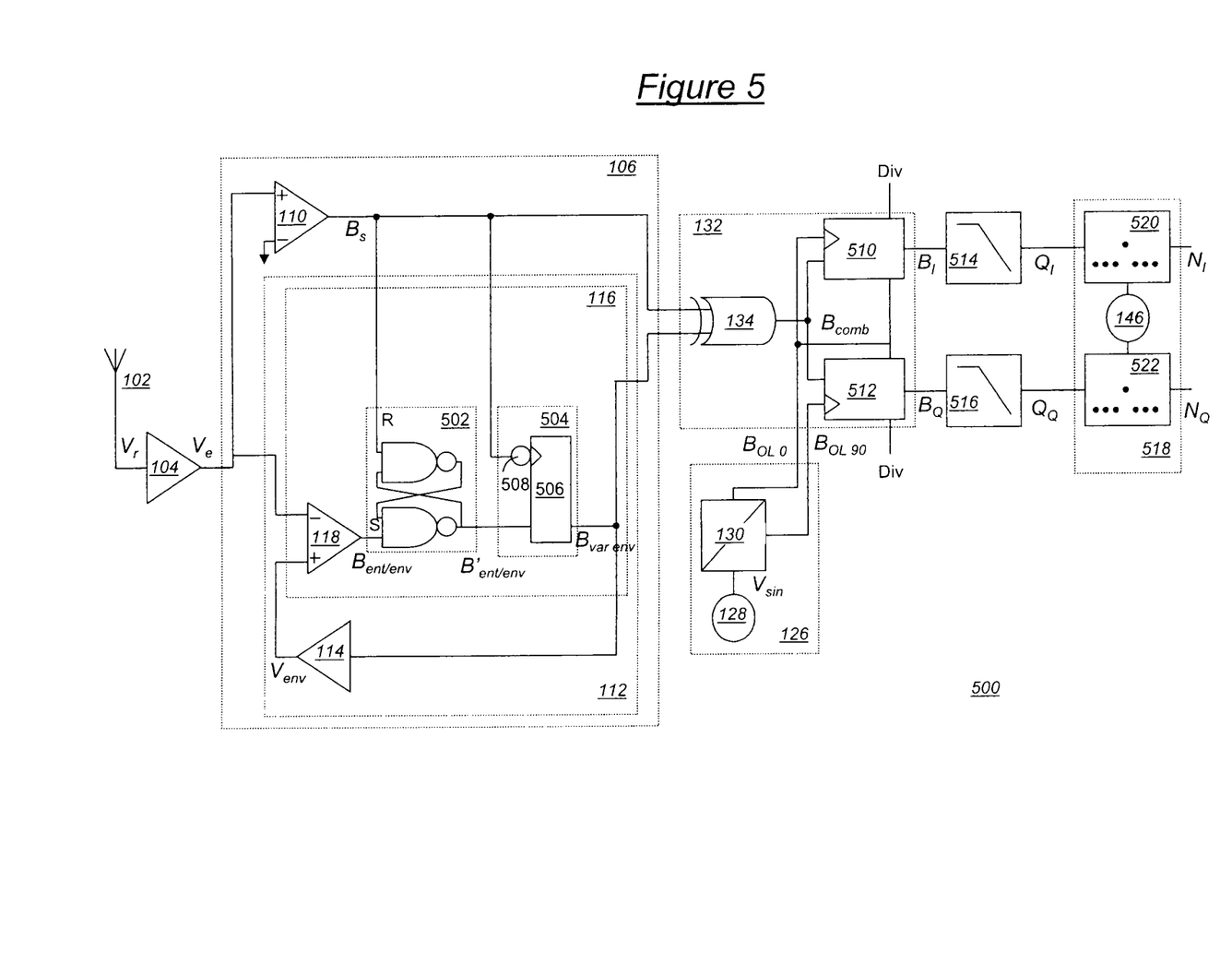
FIG. 5 is a diagram which represents a radio receiver according to a third embodiment of the invention.

With reference to FIG. 5, a radio receiver 500 according to a third embodiment of the invention will now be described. As will be explained below, this radio receiver 500 includes a quantization device which supplies an envelope variation bit $B_{var\ env}$ which is "pseudo sampled" relative to the sign bit $B_S$.

The radio receiver 500 is identical to that of FIG. 1 except that the envelope variation command circuit 116 does not contain either the input/negative envelope comparison circuit 120 or the comparisons combination circuit 125.

Instead, the envelope variation command circuit 116 includes first of all an electronic circuit, called the memorisation circuit 502, designed to supply an electronic signal, called the memorised input/envelope comparison signal $B'_{ent/env}$ which corresponds to the input/envelope comparison signal $B_{ent/env}$ in which a high value which appears in a sign signal cycle $B_S$ is memorised, that is, prolonged, until the end of this cycle. In the example in FIG. 5, memorisation circuit 502 is an RS flip-flop whose R input is connected to the output of the comparator 110, whose S input is connected to the output of the comparator 118 and whose output supplies the memorised input/envelope comparison signal $B'_{ent/env}$. In the example in FIG. 5, the RS flip-flop 502 is made up of NAND logic gates as is known per se.

Alternatively, the comparator 118 may be a memory effect comparator which directly supplies the memorised input/envelope comparison signal $B'_{ent/env}$.

The envelope variation command circuit 116 includes, in addition, an electronic circuit, called the maintain circuit 504, designed to supply the envelope variation signal which corresponds to the memorised input/envelope comparison signal, in which, for each sign bit cycle, the value of the input/envelope comparison signal memorised at the start of the cycle is captured and maintained until the end of the cycle. Thus, since the sign signal $B_s$ depends only on the input signal, the envelope variation signal $B_{var\ env}$ remains quantized in continuous time and is therefore not affected by any spectrum aliasing. In the example described, capture is carried out on the descending fronts of the sign signal $B_s$. Thus in the example in FIG. 5 the maintain circuit 504 is a flip-flop D designed to sample on the descending fronts of its timer input. Its input D is connected to the RS flip-flop 502 output, its timer input is connected to the output of the comparator 110 and its output Q supplies the envelope variation signal $V_{var\ env}$.

Thus the circuits 502 and 504 form an electronic circuit designed to supply the envelope variation signal so that it takes its high value throughout a sign signal cycle when the input/envelope comparison signal has taken its high value over at least part of the previous sign cycle, and its low value otherwise.

Furthermore, in this embodiment, the positive and negative slopes of the envelope generator 114 have the same absolute value.

The quantizer 106 of the receiver 500 offers the advantage of supplying an envelope variation signal whose transitions from one value to another are spaced apart over a time period which is at least equal to the carrier period. Thus the values of the envelope variation signal are fully propagated in the logic components which make up the rest of the receiver 500. Furthermore, there is no point in having two different integration constants, and this allows an integrator 114 to be used which has only a single integration constant.

Furthermore, the phase and quadrature multipliers in FIG. 1 are replaced by samplers, called, respectively a phase sampler 502 and a quadrature sampler 512, whose signal input is connected to the output of the logic gate 134 and whose timer inputs are connected to the outputs of the quadrature circuit 130.

Furthermore, the low-pass phase and quadrature continuous time filters are replaced by digital low pass phase 514 and quadrature 516 filters, in particular discrete time filters.

Furthermore the double sampler in FIG. 1 is replaced by a double decimator 518 which includes two decimators, called, respectively, a phase decimator 520 and quadrature decimator 522, whose inputs are connected to the low frequency timer 146 and to the output of, respectively, the phase low-pass filter 514 and quadrature 516 low-pass filter, and whose outputs supply in-phase $N_I$ and in-quadrature $N_Q$ base band digital signals.

Figure 6:
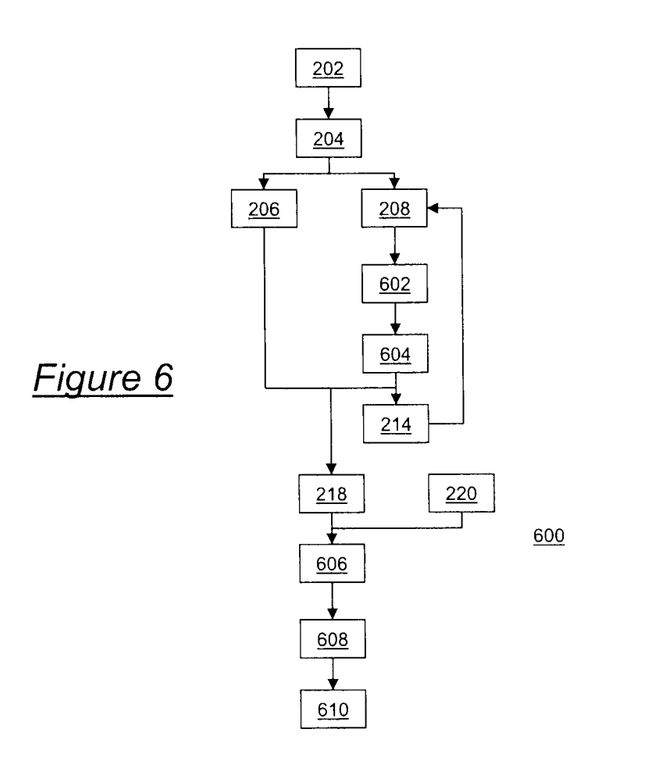
FIG. 6 is a block diagram illustrating the successive steps in a reception method implemented by the radio receiver in FIG. 5.

With reference to FIG. 6, the operation of the receiver 500 in FIG. 5 follows the method in FIG. 2 apart from the following changes.

First of all, steps 210, 212 and 216 are deleted. Instead, step 208, during which the comparator 188 supplies the input/envelope comparison signal $B_{ent/env}$, is followed by a step 602 during which the memorisation circuit 502 memorises the high values of the input/envelope comparison signal $B_{ent/env}$ up to the end of the sign signal $B_s$ cycle where they appear. Then, during a step 604, the maintain circuit 504 captures, at the start of the sign signal cycle, the signal thus memorised and maintains it throughout the entire cycle in order to supply the envelope variation signal $B_{var\ env}$ used in step 214 and in step 218.

Furthermore, steps 222 to 226 are replaced by the following steps 606 to 610.

During step 606 the phase sampler 510 and quadrature sampler 512 sample the combined signal $B_{comb}$ in relation to, respectively, the in-phase local oscillator signal $B_{OL\ 0}$ and in quadrature local oscillator signal $B_{OL\ 90}$ to supply the phase $B_I$ and quadrature $B_Q$ base band binary signals.

During step 608, the digital low-pass filters filter the phase base band binary signal $B_I$ and quadrature base band binary signal $B_Q$ to supply phase base band digital signal $Q_I$ and quadrature base band digital signal $Q_Q$, with these latter being decimated, during step 610, in order to supply lower frequency phase base band digital signal $N_I$ and quadrature base band digital signal $N_Q$.

Figure 7:
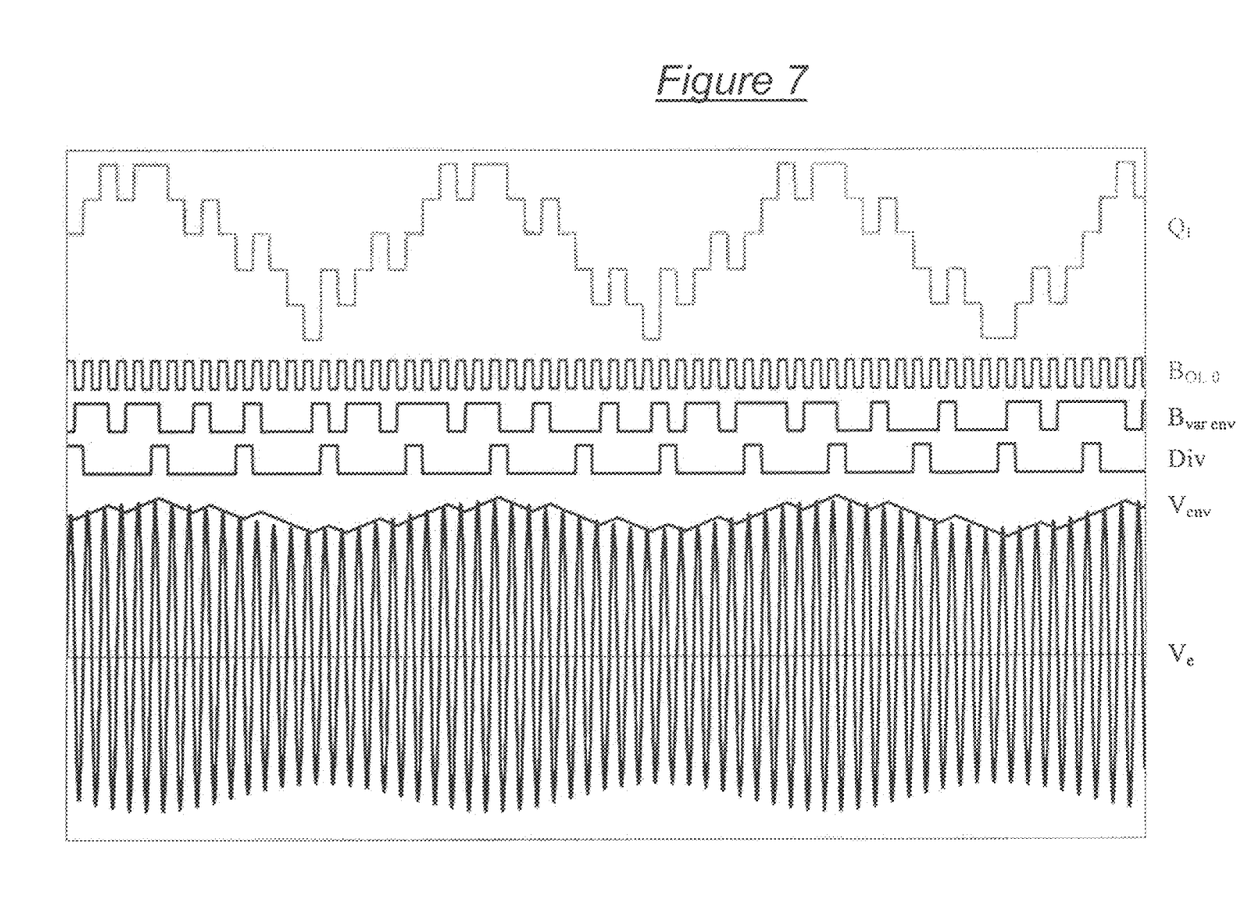
FIG. 7 is a diagram which represents the evolution over time of electrical signals at various points of the radio receiver in FIG. 5 during its operation.

The variations over time of the input signal $V_e$, the envelope signal $V_{env}$, the envelope variation signal $B_{var\ env}$, the in-phase local oscillator signal $B_{OL\ 0}$ and the in-phase base band quantized signal $Q_I$ are illustrated in FIG. 7.

An explanation will now be given of how the integration constant of the quantization device in FIG. 5 should preferably be selected in the case where the input signal $V_e$ is made up of an amplitude modulated carrier of carrier period T0 (carrier frequency F0 and carrier pulse ω0). The amplitude of the non-modulated carrier is A0 and M(t) is the modulation function between 0 and 1 and which has a bandwidth called BW, less than F0. The input signal $V_e$ is therefore of the form:

$$V_e = A0 \cdot M(t) \cdot \sin(\omega 0 \cdot t)$$

Under these conditions, the integration constant of the integrator 114, referred to as P, must preferably be selected so that the modulation function M(t) is quantized, and not the carrier. In order to prevent the base band BW from being truncated by the integrator, the integration constant P must have a minimum value of π·A0·BW, which represents the maximum slope of the highest frequency in the bandwidth BW and which occurs at −½BW and +½BW.

Similar results may be found for other embodiments of quantizers in the invention. In the case of a signal which is already in its base band between 0 and BW, P can be selected using the formula P ≧ 2π·A0·BW.

Figure 8:
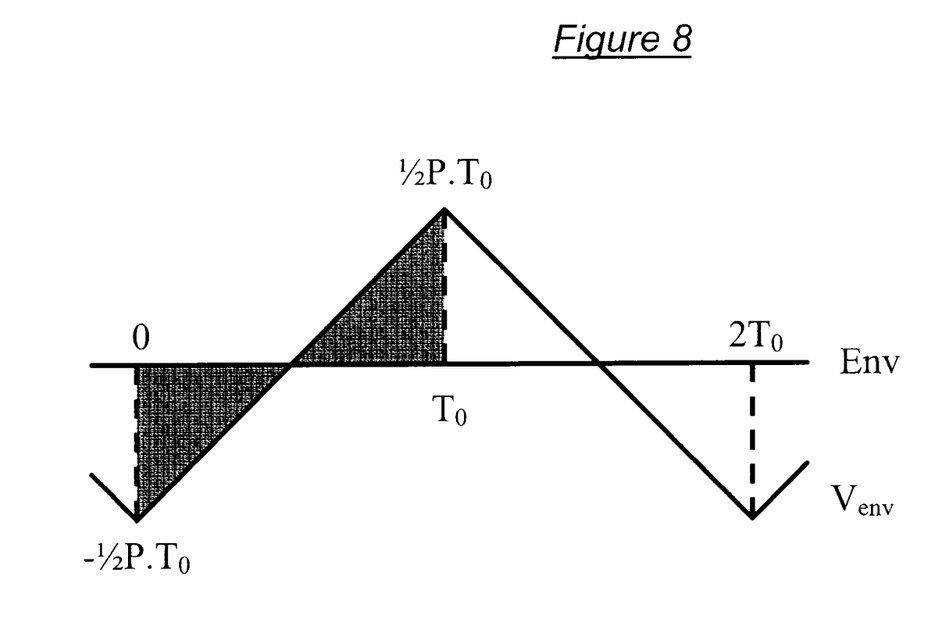
FIG. 8 is a graph which represents the evolution over time of the amplitude modulation of an amplitude modulated signal and of the envelope obtained in the radio receiver in FIG. 5.

With reference to FIG. 8, an attempt will now be made to express the quantization noise for the quantizer for FIG. 5, still as part of the case where the input signal $V_e = A0 \cdot M(t) \cdot \sin(\omega 0 \cdot t)$.

FIG. 8 represents the changes over time of the theoretical envelope, called Env, that is, of the amplitude modulation, assumed to be constant in this figure, and of the envelope signal $V_{env}$ obtained at the output of the integrator 114.

As can be seen in FIG. 8 the quantization noise (hatched area) is a consequence of the approximation of the theoretical envelope of the input signal by a triangular signal with slopes +P and −P. Between 0 and T0, this curve is expressed by: P·t−½P·T0. The smaller the integration constant P then the lower the quantization noise.

The quantization noise as an RMS value is given by:

$$\sigma = \sqrt{\frac{P^2}{T_0} \int_0^{T_0} (t - T_0/2)^2 \cdot dt} = \frac{P \cdot T_0}{\sqrt{12}}$$

It can therefore be seen that there is the same quantization noise as for a conventional analogue-digital converter $$\left( \sigma = \frac{LSB}{\sqrt{12}} \right).$$

The factor P·T0, which is the minimum amplitude variation, is the equivalent to the LSB of a conventional analogue digital converter.

The signal to noise ratio of the quantization may therefore be determined for a signal of amplitude A0 by:

$$SNR = \frac{\sqrt{12}}{\pi} \cdot \frac{F_0}{BW}$$

where F0 is the carrier frequency and BW the bandwidth of the input signal.

It can be seen that in order to increase the signal to noise ratio, it is beneficial to increase the carrier frequency and to reduce the bandwidth, with the maximum bandwidth being set by the P that is chosen.

For example, by using the invention with the ZigBee standard in which the band extends from about 2.4 GHz to 2.48 GHz, the signal to noise ratio in this band of 80 MHz reaches at least 30 dB. Since each transmission channel has a width of about 2 MHz, over 60 dB of signal to noise per channel is achieved, that is, the equivalent of over 10 bits of a Flash converter operating at least 5 GS/sec.

It is therefore clearly seen that a quantization device such as that described above allows a signal quantized over a very small number of bits (two bits) to be obtained without to much loss of information.

It should be noted in addition that the invention is not restricted to the embodiments described above. Those skilled in the art will see that various modifications may be made to the embodiments described above, in the light of the information that has just been divulged. In particular, a quantization device according to the invention may be used in devices other than a radio receiver.

In the claims that follow, the terms used must not be regarded as restricting the claims to the embodiments presented in the present description, but must be interpreted as including all the equivalents that the claims aim to cover as a result of their formulation and the prediction of which is within the power of those skilled in the art by applying their general knowledge to the implementation of the information that has just been divulged to them.

The invention claimed is:

1. A device for continuous time quantization of an analogue input signal in order to supply a continuous time output signal that is quantized as two bits, said device comprising:
   a sign analysis circuit that supplies a first bit of the continuous time output signal quantized as two-bits which at any time takes a first value when the input signal is positive and a second value when the input signal is negative, and
   an envelope analysis circuit that supplies a second bit of the continuous time output signal quantized as two-bits which at any time takes a high value when an envelope signal of the input signal is increasing, and a low value when the envelope signal is decreasing.

2. Device according to claim 1 in which the envelope analysis circuit includes:
   an envelope variation command circuit, comprising a comparator that supplies a binary input/envelope comparison signal, which takes a first value when the envelope signal is greater than the input signal and a second value when the envelope signal is less than the input signal, and supplies the second bit of the continuous time output signal quantized as two-bits, from the input/envelope comparison signal, and
   an envelope signal generation circuit that generates the envelope signal, so that the envelope signal is selectively increasing or decreasing depending on a value of the second bit of the continuous time output signal quantized as two bits.

3. The device according to claim 2, in which the envelope signal is piecewise linear, and in which the envelope generation circuit generates the envelope signal selectively with a predetermined positive slope and a predetermined negative slope, depending on the second bit of the continuous time output signal quantized as two-bits.

4. The device according to claim 2, which further comprising:
   an input/negative envelope comparison circuit that supplies a binary input/negative envelope comparison signal, which takes a first value when an opposite of the envelope signal is greater than the input signal, and a second value when the opposite of the envelope signal is less than the input signal, and
   a comparisons combination circuit that supplies the second bit of the continuous time output signal quantized as two-bits from the input/envelope comparison signal and from the input/negative envelope comparison signal.

5. The device according to claim 2, in which the envelope variation command circuit includes an electronic circuit that supplies the second bit of the continuous time output signal quantized as two-bits so that the second bit of the continuous time output signal quantized as two bits takes a high value throughout a cycle of the first bit of the continuous time output signal quantized as two-bits when the input/envelope comparison signal has taken a high value over at least part of a previous cycle of the first bit of the continuous time output signal quantized as two-bits, and a low value otherwise.

6. The device according to claim 5, in which the electronic circuit that supplies the second bit of the continuous time output signal quantized as two-bits includes a memorization circuit that supplies a memorized input/envelope comparison signal which corresponds to the input/envelope comparison signal in which a high value, which appears in a cycle of the first bit of the continuous time output signal quantized as two-bits, is memorized until an end of the cycle of the first bit of the continuous time output signal quantized as two-bits.

7. The device according to claim 6, in which the circuit that supplies the second bit of the continuous time output signal quantized as two-bits includes a maintain circuit that supplies the second bit of the continuous time output signal quantized as two-bits, which corresponds to the memorized input/envelope comparison signal in which, for each cycle of the first bit of the continuous time output signal quantized as two-bits, a value of the memorized input/envelope comparison signal, memorized at the start of the cycle of the first bit of the continuous time output signal quantized as two-bits, is captured and maintained up to an end of the cycle of the first bit of the continuous time output signal quantized as two-bits.

8. A radio-frequency signal receiver, comprising:
   an antenna that senses a radio-frequency signal and that converts into an electrical signal,
   the device for continuous time quantization of claim 1, which quantizes in continuous time the input signal, which is obtained from the electrical signal supplied by the antenna,
   a local radio oscillator circuit that generates first and second signals, respectively, an in-phase and in-quadrature local oscillator signals, in quadrature with each other, and
   a double mixer circuit that supplies two binary electrical signals, respectively, an in-phase and in-quadrature base band binary signals which correspond to a mixture of a product of the first bit of the continuous time output signal quantized as two-bits and of the second bit of the continuous time output signal quantized as two-bits with, respectively, the in-phase and in-quadrature local oscillator signals.

9. A method for quantization of an analogue input signal in order to supply a continuous time output signal quantized as two bits, said method comprising:
   supplying, with a sign analysis circuit, a first bit of the continuous time output signal quantized as two bits, which at any time takes a first value when the input signal is positive and a second value when the input signal is negative, and
   supplying, with an envelope analysis circuit, a second bit of the continuous time output signal quantized as two bits, which at any time takes a high value when an envelope signal of the input signal is increasing, and a low value when the envelope signal is decreasing.

* * * * *